(12) United States Patent
Cheng et al.

(10) Patent No.: US 9,236,389 B1
(45) Date of Patent: Jan. 12, 2016

(54) EMBEDDED FLASH MEMORY FABRICATED IN STANDARD CMOS PROCESS WITH SELF-ALIGNED CONTACT

(71) Applicant: INTERNATIONAL BUSINESS MACHINES CORPORATION, Armonk, NY (US)

(72) Inventors: Kangguo Cheng, Schenectady, NY (US); Ramachandra Divakaruni, Ossining, NY (US); Subramanian S. Iyer, Mount Kisco, NY (US); Ali Khakifirooz, Los Altos, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/457,579

(22) Filed: Aug. 12, 2014

(51) Int. Cl.
*H01L 27/115* (2006.01)

(52) U.S. Cl.
CPC ................. *H01L 27/11521* (2013.01)

(58) Field of Classification Search
USPC ................... 257/315, 316; 438/257
See application file for complete search history.

(56) References Cited

U.S. PATENT DOCUMENTS

| 5,811,853 | A  | 9/1998  | Wang |
| 6,387,804 | B1 | 5/2002  | Foster |
| 7,109,102 | B2 | 9/2006  | Bohr |
| 7,214,579 | B2 | 5/2007  | Widdershoven et al. |
| 8,154,088 | B1 | 4/2012  | Khoueir et al. |
| 8,368,052 | B2 | 2/2013  | Pillarisetty et al. |
| 8,564,041 | B2 | 10/2013 | Hui et al. |
| 2008/0061353 | A1* | 3/2008 | Oh et al. ........................ 257/315 |
| 2009/0162951 | A1* | 6/2009 | Orimoto et al. ................. 438/8 |
| 2010/0006915 | A1* | 1/2010 | Lee et al. ...................... 257/315 |

FOREIGN PATENT DOCUMENTS

JP        2005150159 A      6/2005

* cited by examiner

*Primary Examiner* — David Vu
*Assistant Examiner* — Brandon Fox
(74) *Attorney, Agent, or Firm* — Scully, Scott, Murphy & Presser, P.C.; Steven J. Meyers (57) ABSTRACT

After forming a plurality of gate structures over a substrate having a plurality of active regions separated from each other by at least one shallow trench isolation (STI) regions, inter-gate dielectric contact structures extending through an inter-level dielectric (ILD) layer that surrounds the gate structures are formed. Each inter-gate dielectric contact structure encloses a corresponding gate structure and is in contact with a dielectric gate cap and a dielectric gate spacer of the corresponding gate structure and a portion of the at least one STI region abutting the dielectric gate spacer of the corresponding gate structure. The inter-gate dielectric contact structure is electrically insulated from a gate conductor in the corresponding gate structure by the dielectric gate cap and the dielectric gate spacer and serves as a control gate in a memory cell of a flash memory array.

20 Claims, 9 Drawing Sheets

EMBEDDED FLASH MEMORY FABRICATED IN STANDARD CMOS PROCESS WITH SELF-ALIGNED CONTACT

BACKGROUND

The present application relates to semiconductor device fabrication. More particularly, the present application relates to a flash memory device that can be fabricated using a standard complimentary metal-oxide-semiconductor (CMOS) process.

Embedded non-volatile memory (NVM) devices have been widely used to store code and security information or trim information in integrated circuits. Among them, embedded flash memory cells in particular have been incorporated into CMOS integrated circuits. Commercially available flash memory cells generally include a control gate, a floating gate and two interposed dielectric layers disposed upon a semiconductor substrate. The presence of the additional floating gate in flash memory cells compared to field effect transistors requires dedicated device processing in order to integrate the flash memory cells into an integrated circuit. This includes additional steps of depositing an inter-gate dielectric and a control gate, raising additional challenges in gate patterning and gate spacer formation. These additional processing steps result in longer processing times, higher manufacturing costs and low yield. As such, a process flow to fabricate flash memory cells that is compatible with a standard CMOS fabrication process is highly desirable.

SUMMARY

The present application provides a flash memory array that can be fabricated using a standard CMOS fabrication process and therefore can be easily embedded in an integrated circuit. After forming a plurality of gate structures over a substrate having a plurality of active regions separated from each other by at least one shallow trench isolation (STI) regions, inter-gate dielectric contact structures extending through an interlevel dielectric (ILD) layer that surrounds the gate structures are formed. Each inter-gate dielectric contact structure encloses a corresponding gate structure and is in contact with a dielectric gate cap and a dielectric gate spacer of the corresponding gate structure and a portion of the at least one STI region abutting the dielectric gate spacer of the corresponding gate structure. The inter-gate dielectric contact structure is electrically insulated from a gate conductor in the corresponding gate structure by the dielectric gate cap and the dielectric gate spacer and serves as a control gate in a memory cell of a flash memory array.

In one aspect of the present application, a flash memory array is provided. The flash memory array includes a substrate comprising a plurality of active regions separated from each other by at least one shallow trench isolation (STI) region, a plurality of gate structure formed over the plurality of active regions, and a plurality of control gates extending through an interlevel dielectric (ILD) layer. Each of the plurality of gate structures includes a vertical stack of a gate dielectric, a floating gate and a dielectric gate cap, and a dielectric gate spacer present on each sidewall of the vertical stack. Each of the plurality of control gates encloses a portion of a corresponding gate structure located at the at least one STI region and is in contact with the dielectric gate cap, the dielectric gate spacer and a portion of the at least one STI region abutting the dielectric gate spacer such that each of the plurality of control gates is electrically insulated from the floating gate by the dielectric gate cap and the dielectric gate spacer.

In another aspect of the present application, a method of forming a flash memory array is provided. The method of forming a flash memory array includes first forming a plurality of gate structures over a substrate having a plurality of active regions separated from each other by at least one shallow trench isolation (STI) region. Each of the plurality of gate structures includes a vertical stack of a gate dielectric, a gate conductor and a dielectric gate cap, and a dielectric gate spacer present on each sidewall of the vertical stack. After forming a source region and a drain region on opposite side of each of the plurality of gate structures, an interlevel dielectric (ILD) layer is formed over the substrate. The ILD layer has a planar top surface above topmost surfaces of the plurality of gate structures. Next, a plurality of inter-gate dielectric contact openings and a plurality of source/drain contact openings are formed through the ILD layer. Each of the plurality of inter-gate dielectric contact openings exposes a portion of a corresponding gate structure located at the at least one STI region and a portion of the at least one STI region abutting the dielectric gate spacer of the corresponding gate structure, and each of the plurality of source/drain contact openings exposes a portion of a source region or a drain region. The plurality of inter-gate dielectric contact openings and the plurality of source/drain contact openings are then filled with a conductive material to provide a plurality of inter-gate dielectric contact structures and a plurality of source/drain contact structures.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
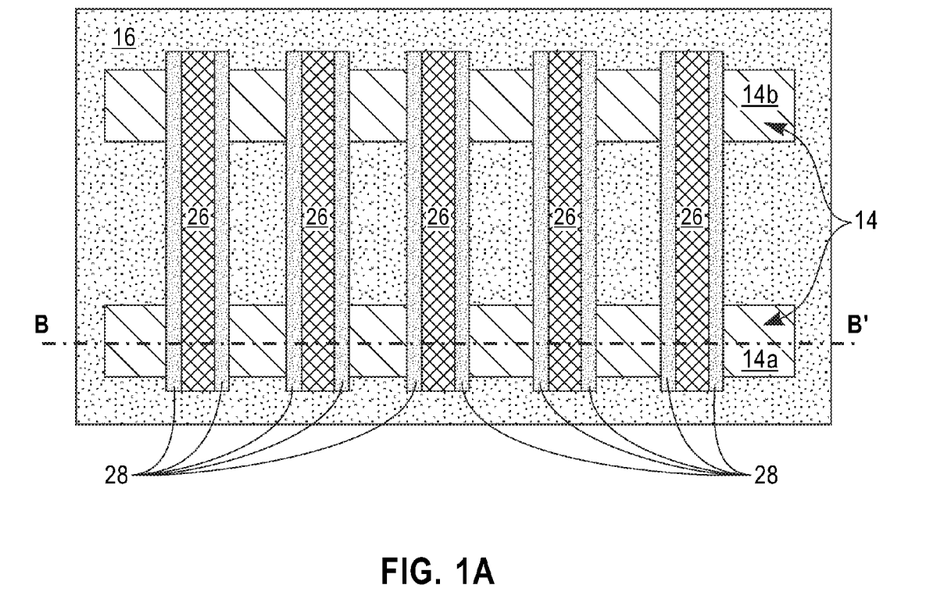
FIG. 1A is a top view of an initial semiconductor structure including a semiconductor substrate having a plurality of gate structures formed thereupon that can be employed in some embodiments of the present application.
Figure 1B:
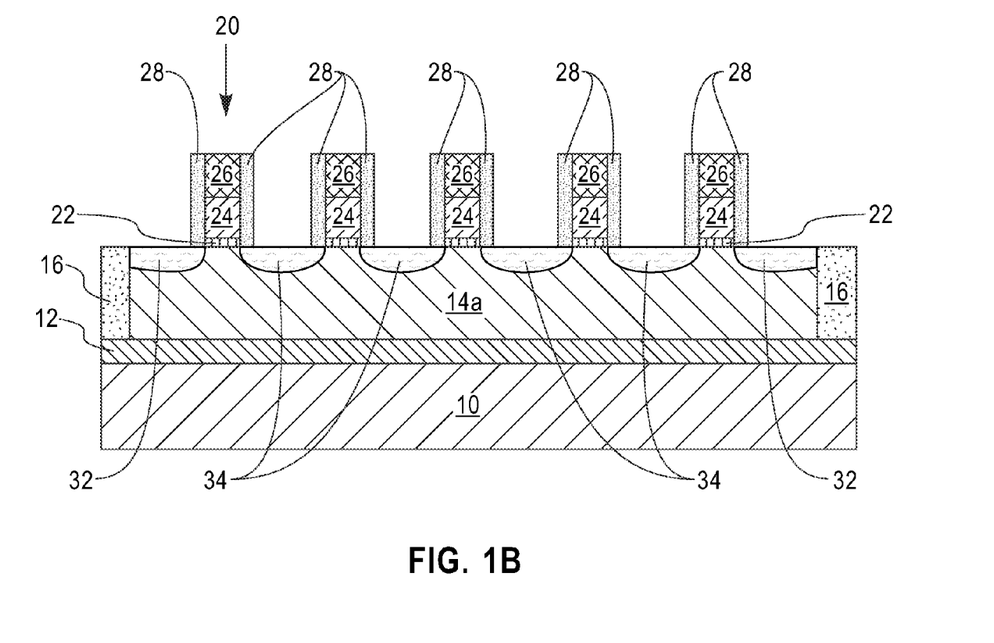
FIG. 1B is a cross-sectional view of the semiconductor structure of FIG. 1A along line B-B'.

Referring to FIGS. 1A-1B, an exemplary semiconductor structure of the present application includes a semiconductor substrate having a plurality of gate structures 20 formed thereupon. In one embodiment and as shown in FIG. 1B, the semiconductor substrate is a semiconductor-on-insulator (SOI) substrate that includes a handle substrate 10, a buried insulator layer 12, and a top semiconductor layer 14. The top semiconductor layer 14 is divided into a plurality of active regions which are separated from each other by at least one shallow trench isolation (STI) region 16 in a widthwise direction. In one embodiment and as shown in FIG. 1A, the top semiconductor layer 14 is divided into a first active region 14a and a second active region 14b.

Each of the handle substrate 10 and the top semiconductor layer 14 comprises a semiconductor material such as, for example, Si, Ge, SiGe, SiC, SiGeC, and III/V compound semiconductors such as, for example, InAs, GaAs, and InP. The semiconductor material of the handle substrate 10 and the top semiconductor layer 14 may be the same, or different. Typically, each of the handle substrate 10 and the top semiconductor layer 14 comprises a single crystalline semiconductor material. For example, the single crystalline semiconductor material may be Si.

The thickness of the handle substrate 10 is typically from 400 μm to 1,000 μm, and typically from 50 μm to 900 μm.

The thickness of the top semiconductor layer 14 may be from 10 nm to 200 nm, with a thickness from 30 nm to 70 nm being more typical. In some embodiments and when an ETSOI (extremely thin semiconductor-on-insulator) substrate is employed, the top semiconductor material layer 14 can have a thickness of less than 10 nm. If the thickness of the top semiconductor material layer 14 is not within one of the above mentioned ranges, a thinning step such as, for example, planarization or etching can be used to reduce the thickness of top semiconductor material layer 14 to a value within one of the ranges mentioned above. The top semiconductor layer 14 may be implanted with dopants of p-type or n-type. Examples of p-type dopants include, but are not limited to, boron, aluminum, gallium and indium. Examples of n-type dopants, include but are not limited to, antimony, arsenic and phosphorous.

The buried insulator layer 12 comprises a dielectric material such as silicon oxide, silicon nitride, silicon oxynitride, or a combination thereof. The thickness of the buried insulator layer 12 may be from 1 nm to 200 nm, with a thickness from 100 nm to 150 nm being more typical.

The at least one STI region 16 can be formed in the top semiconductor layer 14 utilizing a conventional trench isolation process. In one embodiment, the at least one STI region 16 can be formed by etching the top semiconductor layer 14 utilizing a dry etch, such as reactive ion etch (RIE) or plasma etching. Portions of the top semiconductor layer 14 are subsequently removed and replaced by a dielectric material such as silicon oxide resulting in STI regions 16. In one embodiment and as shown in FIG. 1A, as a result of the formation of the at least one STI region 16, the top semiconductor layer 14 is divided into active regions 14a, 14b.

Each gate structure 20 includes a gate stack (22, 24, 26) and a dielectric gate spacer 28 located on each sidewall of the gate stack (22, 24, 26). The gate stack is composed of a vertical stack of a gate dielectric 22, a gate conductor 24 and a dielectric gate cap 26. The gate stack (22. 24, 26) can be formed by first providing a material stack (not shown) including, from bottom to top, a gate dielectric layer, a gate conductor layer and a dielectric gate cap layer over the SOI substrate.

The gate dielectric layer may include any gate insulating material such as, for example, an oxide, a nitride, an oxynitride or a multilayered stack thereof. In some embodiments, the gate dielectric layer is composed of a semiconductor oxide, a semiconductor nitride or a semiconductor oxynitride. In other embodiments, the gate dielectric layer includes a dielectric metal oxide having a dielectric constant that is greater than the dielectric constant of silicon oxide, e.g., 3.9. Typically, the gate dielectric layer that is employed has a dielectric constant greater than 4.0, with a dielectric constant of greater than 8.0 being more typical. Such dielectric materials are referred to herein as a high-k dielectric material. Examples of high-k dielectric material include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high-k dielectric materials can also be employed as the gate dielectric layer. Each value of x is independently from 0.5 to 3 and each value of y is independently from 0 to 2.

The gate dielectric layer can be formed by utilizing a deposition process such as, for example, chemical vapor deposition (CVD), physical vapor deposition (PVD), molecular beam deposition (MBD), pulsed laser deposition (PLD), liquid source misted chemical deposition (LSMCD) and atomic layer deposition (ALD). Alternatively, the gate dielectric layer can be formed by a thermal process such as, for example, thermal oxidation and/or thermal nitridation of top portions of the first and the second active regions 14a, 14b of the top semiconductor layer 14. The gate dielectric layer that is formed can have a thickness from 1 nm to 10 nm, with a thickness from 2 nm to 5 nm being more typical. When a high-k gate dielectric is employed as the gate dielectric layer, the high-k gate dielectric layer can have an effective oxide thickness on the order of, or less than, 1 nm.

The gate conductor layer may comprise any conductive material including, but not limited to, polycrystalline silicon, polycrystalline silicon germanium, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the gate conductor layer is comprised of polycrystalline silicon.

The gate conductor layer can be formed utilizing a conventional deposition process including, for example, CVD, plasma enhanced chemical vapor deposition (PECVD), evaporation, PVD, sputtering, chemical solution deposition and ALD. When silicon-containing materials are used as the gate conductor layer, the silicon-containing materials can be doped with an appropriate impurity by utilizing either an in-situ doping deposition process or by utilizing deposition, followed by a step such as ion implantation or gas phase doping in which the appropriate impurity is introduced into the silicon-containing material. The gate conductor layer that is formed typically has a thickness from 10 nm to 100 nm, with a thickness from 20 nm to 50 nm being even more typical.

The dielectric gate cap layer may include a dielectric material such as an oxide, a nitride or an oxynitride. In one embodiment, the dielectric gate cap layer is comprised of silicon nitride. The dielectric gate cap layer can be formed utilizing a conventional deposition process including, for example, CVD and PECVD. The dielectric gate cap layer that is formed can have a thickness comparable to a thickness of an inter-gate dielectric that employed in conventional flash memory cells. In one embodiment, the thickness of the dielectric cap layer is no greater than 10 nm.

The material stack can then be patterned by lithography and etching to form the gate stacks (22, 24, 26). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as a RIE process. The remaining portions of the material stack after the pattern transfer constitute the gate stacks (22, 24, 26).

The dielectric gate spacer 28 includes any dielectric material such as, for example, an oxide, a nitride, an oxynitride, or any combination thereof. For example, the dielectric gate spacer 28 may be composed of silicon nitride, silicon boron carbon nitride (SiBCN), or silicon carbon oxynitride (SiOCN). In some embodiments of the present application, the dielectric gate spacer 28 is comprised of a same dielectric material as that of the dielectric gate cap 26. In one embodiment, the dielectric gate spacer 28 is composed of silicon nitride.

The dielectric gate spacer 28 can be formed by first depositing a conformal dielectric gate spacer layer (not shown) on exposed surfaces of the gate stacks (22, 24, 26) and the SOI substrate utilizing a conventional deposition process including, for example, CVD or ALD, followed by an anisotropic etch that removes horizontal portions of the conformal dielectric gate spacer layer. The remaining vertical portions of the conformal dielectric gate spacer layer constitute the dielectric gate spacer 28. The dielectric gate spacer 28 that is formed can have a thickness comparable to a thickness of an inter-gate dielectric that employed in conventional flash memory cells. In one embodiment, the thickness of the dielectric gate spacer 28, as measured at the base, is no greater than 10 nm.

Optionally, halo implantation and/or source and drain implantation may be performed to form halo regions (not shown) and/or source and drain extension regions (not shown) prior to formation of the dielectric gate spacer 28. After formation of the dielectric gate spacer 28, at least one source and drain ion implantation is performed to form a source region and a drain region (collectively referred to as source/drain regions) on opposite sides of the gate structures 20. The source/drain regions are located directly beneath top surfaces of the first and second active region 14a, 14b. In one embodiment and as shown in FIG. 1B, source/drain regions located between the at least one STI region 16 and neighboring gate structures 20 are herein referred to as the first source/drain regions 32, while source/drain regions that are located between two adjacent gate structures 20 that connect the gate structures 20 in series are herein referred to as the second source/drain regions 34. In some embodiments, the source/drain regions 32, 34 are formed by in-situ doped epitaxy growth. Optionally the source/drain regions 32, 34 can be recessed before epitaxy.

Figure 2A:
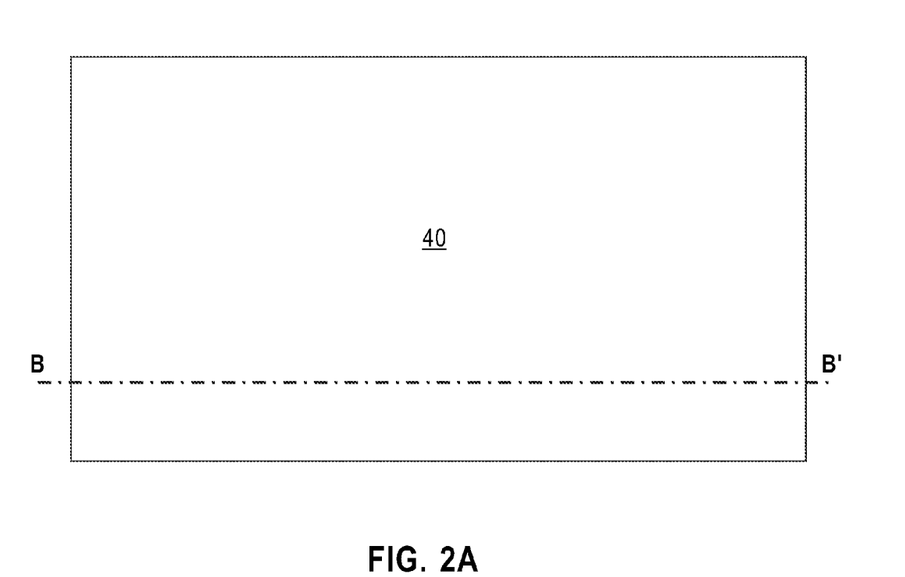
FIG. 2A is a top view of the semiconductor structure of FIG. 1B after forming an interlevel dielectric (ILD) layer over the plurality of the gate structures.
Figure 2B:
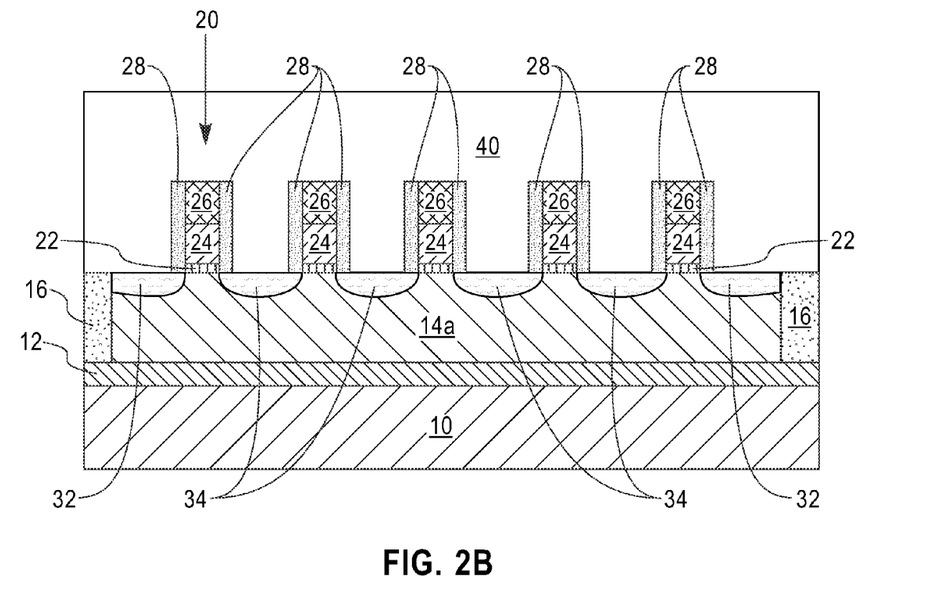
FIG. 2B is a cross-sectional view of the semiconductor structure of FIG. 2A along line B-B'.

Referring to FIGS. 2A-2B, an interlevel dielectric (ILD) layer 40 is formed over the SOI substrate covering the gate structures 20 and source/drain regions 30. The ILD layer 40 can include a dielectric material such as undoped silicon oxide, doped silicon oxide, silicon nitride, porous or non-porous organosilicate glass, porous or non-porous nitrogen-doped organosilicate glass, or a combination thereof. The ILD layer 40 can be formed by CVD, PVD or spin coating. If the ILD dielectric layer 40 is not self-planarizing, the top surface of the ILD layer 40 can be planarized, for example, by chemical mechanical planarization (CMP).

FIGS. 3A through 4C are various top and cross-sectional views illustrating steps for forming a first exemplary flash memory array from the semiconductor structure of FIGS. 2A-2B. The first exemplary flash memory array includes a plurality of memory cells arranged in a "NAND" architecture. In the NAND-type flash memory array, a plurality of memory cells is connected in series between a bit line and ground.

Figure 3A:
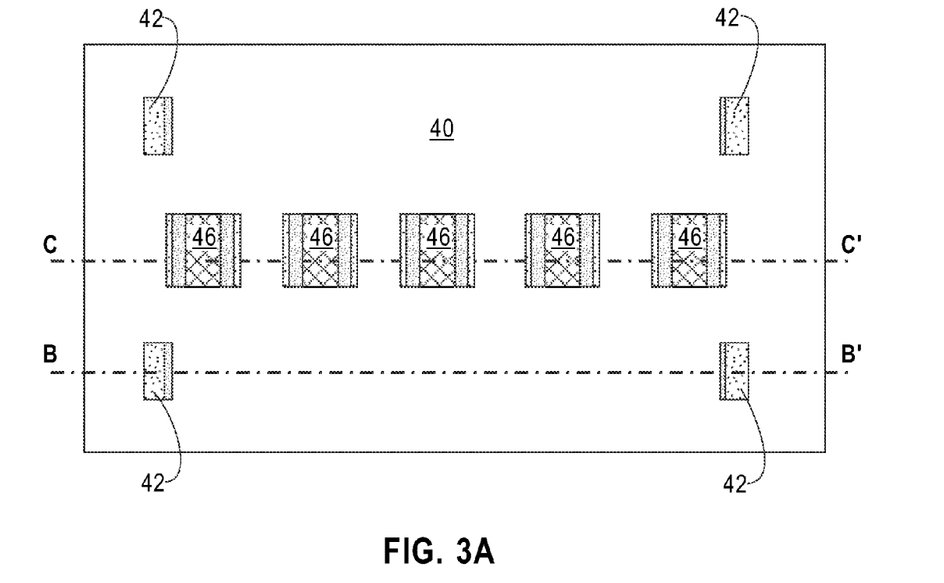
FIG. 3A is a top view of a first exemplary semiconductor structure that can be derived from the semiconductor structure of FIGS. 2A-2B after forming a plurality of source/drain contact openings and a plurality of inter-gate dielectric contact openings through the ILD layer in accordance with one embodiment of the present application.
Figure 3B:
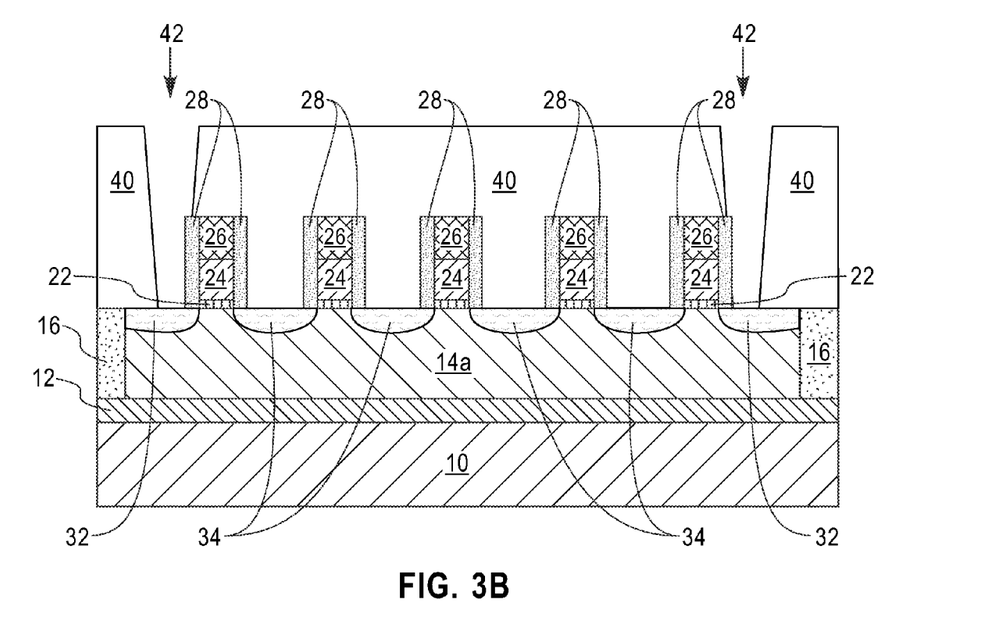
FIG. 3B is a cross-sectional view of the first exemplary semiconductor structure of FIG. 3A along line B-B'.
Figure 3C:
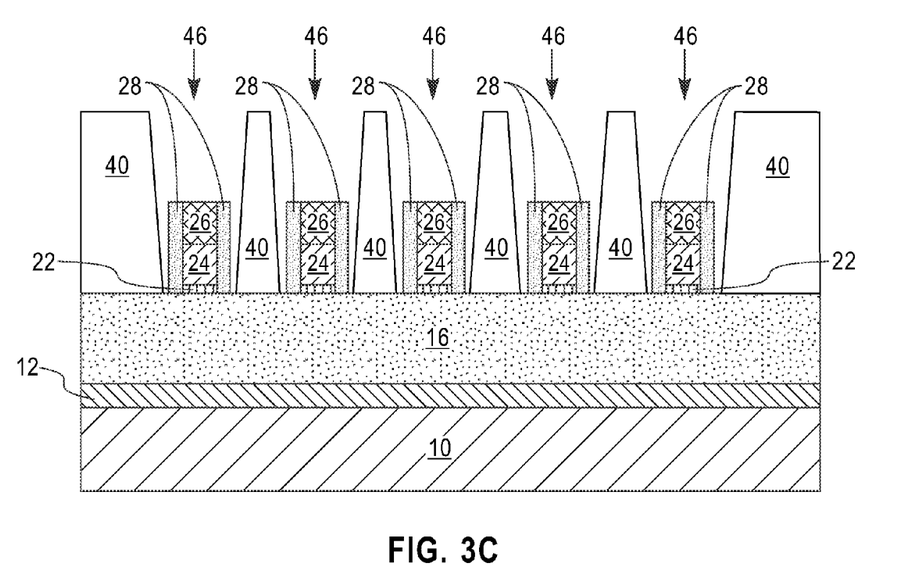
FIG. 3C is a cross-sectional view of the first exemplary semiconductor structure of FIG. 4A along line C-C'.

Referring to FIGS. 3A-3C, various contact openings for the first exemplary flash memory array are formed in the ILD layer 40. The various contact openings can include source/drain contact openings 42 and inter-gate dielectric contact openings 46. The source/drain contact openings 42 extend through the ILD layer 40 to top surfaces of the first source/drain regions 32. In one embodiment of the present application, the source/drain contact openings 42 expose portions of the dielectric gate spacers 28 and portions of the first source/drain regions 32 abutting the dielectric gate spacers 28. Thus, the lateral extent of the source/drain contact openings 42 is limited by the dielectric gate spacer 28, the contact areas at the bottoms of the source/drain contact openings 32 are self-aligned to the dielectric gate spacer 28. The inter-gate dielectric contact openings 46 extend through the ILD layer 40 to a top surface of the at least one STI region 16 located between the first active region 14a and the second active region 14b. The inter-gate dielectric contact openings 46 expose portions of the gate structures 20 and portions of the at least one STI region 16 abutting the dielectric gate spacer 28.

The various contact openings 42, 46 can be formed, for example, by applying a photoresist (not shown) on the top surface of the ILD material layer 40, lithographically patterning openings in the photoresist, and transferring the pattern of the openings in the photoresist through the ILD layer 40. An anisotropic etch having a chemistry that removes the dielectric materials of the ILD layer 40 selective to the semiconductor material of the top semiconductor layer 14 and dielectric materials of the at least one STI region 16, the dielectric gate cap 26 and the dielectric gate spacer 28 can be employed to transfer the pattern into the ILD layer 40. The photoresist is subsequently removed, for example, by ashing.

Figure 4A:
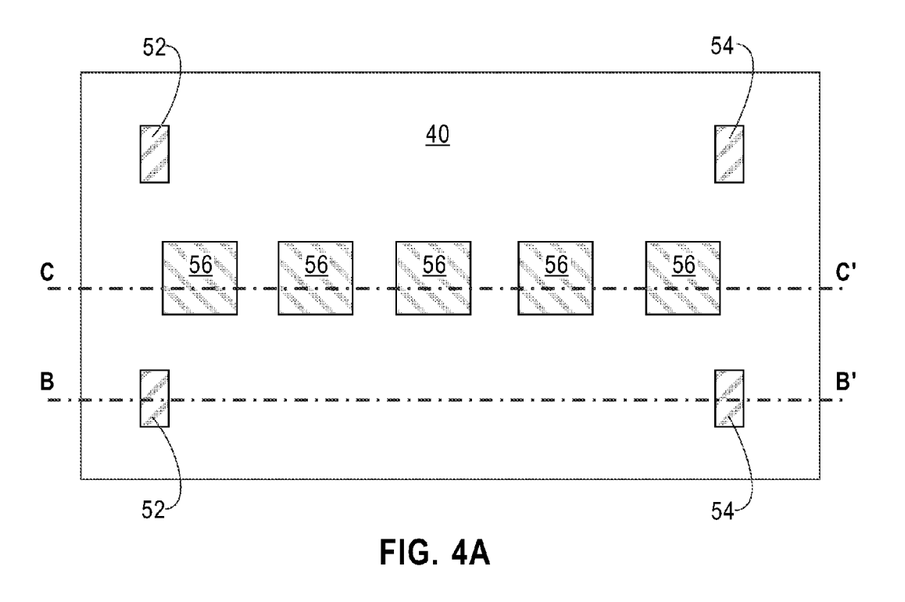
FIG. 4A is a top view of the first exemplary semiconductor structure of FIG. 3A after forming a plurality of source/drain contact structures and a plurality of inter-gate dielectric contact structures.
Figure 4B:
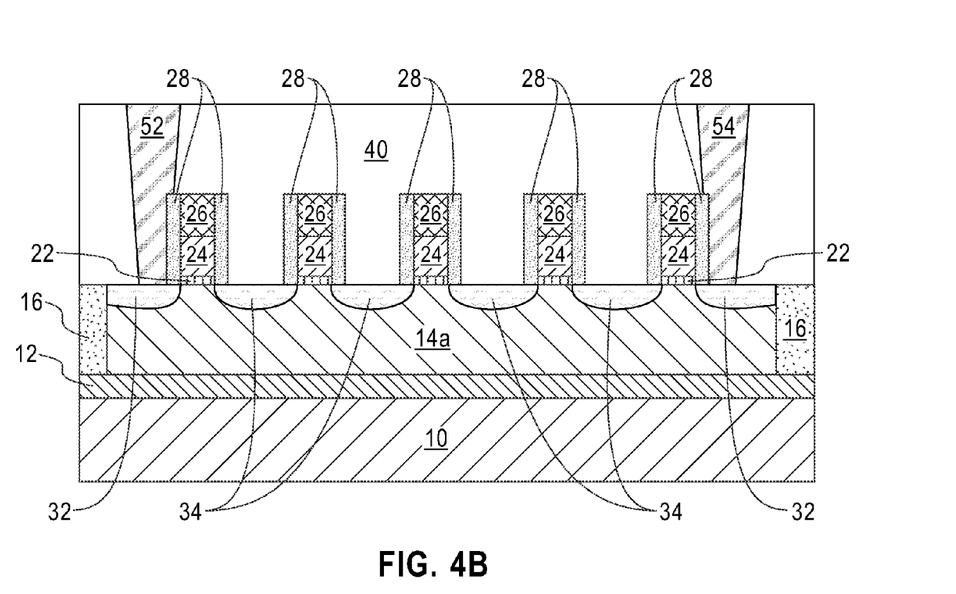
FIG. 4B is a cross-sectional view of the first exemplary semiconductor structure of FIG. 4A along line B-B'.
Figure 4C:
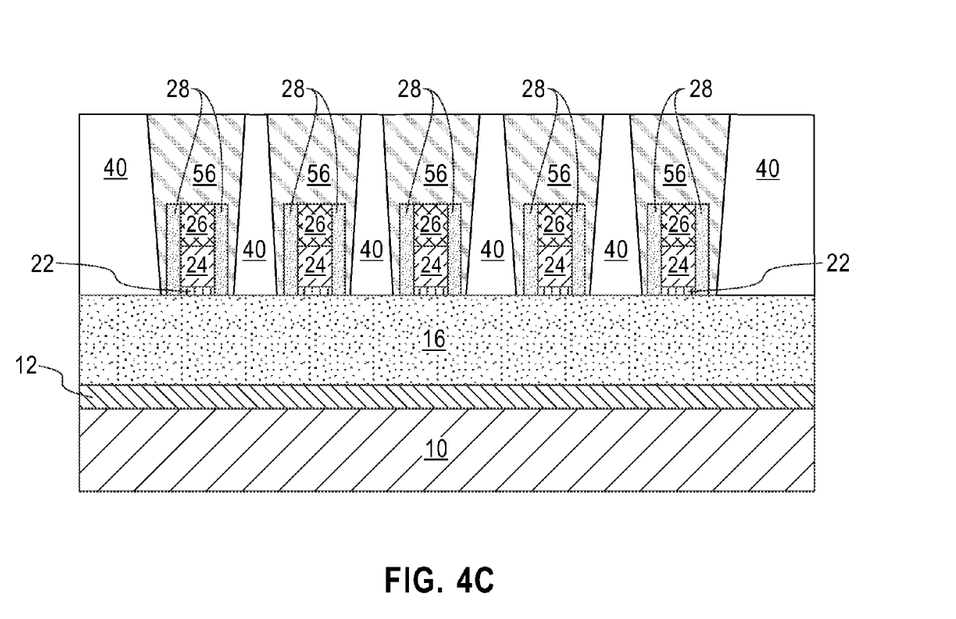
FIG. 4C is a cross-sectional view of the first exemplary semiconductor structure of FIG. 4A along line C-C'.

Referring to FIGS. 4A-4C, various contact structures are formed, for example, by deposition of a conductive material in the various contact openings 42, 46 and removal of excess conductive material from above the ILD layer 40 by a planarization process, which can employ a recess etch or CMP. Exemplary conductive materials that may be employed for the various contact structures include doped polycrystalline or amorphous silicon, germanium, silicon germanium, a metal (e.g., tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), carbon nanotube, conductive carbon, or any suitable combination thereof.

The various contact structures can include first source/drain contact structures 52 that fill a first set of the source/drain contact openings 42 located at a first end of the first and second active regions 14a, 14b, second source/drain contact structures 54 that fill a second set of the source/drain contact openings 42 located at a second end of the first and second active regions 14a, 14b opposite to the first end, and inter-gate dielectric contact structures 56 that fill the inter-gate dielectric contact openings 46. Each of the first and second source/drain contact structures 52, 54 extends through the ILD layer 40 and contacts a portion of a corresponding first source/drain region 32 and a portion of the dielectric gate spacer 28. Each of the inter-gate dielectric contact structures 56 extends through the ILD layer 40 and surrounds a corresponding gate structure 20 such that the inter-gate dielectric contact structure 56 is in contact with exposed surfaces of the dielectric gate cap 26, the dielectric spacer 28 and portions of the STI region 16 abutting the dielectric spacer 28. Since the inter-gate dielectric contact structure 56 is electrically insulated from the gate conductor 24 by the dielectric gate cap 26 and dielectric gate spacer 28, the inter-gate dielectric contact structure 56 can function as a control gate, while the gate conductor 24 functions as a floating gate for a memory cell. The dielectric gate cap 26 and the dielectric gate spacer 28 in each of the gate structures 20 together constitute an inter-gate dielectric for the memory cell.

Thus, a first exemplary flash memory array is formed by using a standard CMOS fabrication process. The first exemplary flash memory array includes a first plurality of memory cells formed in the first active region 14a and a second plurality of memory cells formed in the second active region 14b. Each of the first plurality of memory cells and the second plurality of memory cells includes a gate electric 22, a gate conductor 24, an inter-gate dielectric (26, 28) and a inter-gate dielectric contact structure 56 with the gate conductor 24 serves as a floating gate and the inter-gate dielectric contact structure 56 serves as a control gate. In the first exemplary flash memory array, each of the first source/drain contact structures 52 is connected to ground (not shown), each of the second source/drain contact structures 54 is connected to a bit line (not shown) and each of the inter-gate dielectric contact structures 56 is connected to a word line (not shown).

FIGS. 5A through 6C are various top and cross-sectional views illustrating steps for forming a second exemplary flash memory array from the semiconductor structure of FIGS. 2A-2B. The second exemplary flash memory array includes a plurality of memory cells arranged in a "NOR" architecture. In the NOR-type flash memory array, each memory cell is connected between a bit line and ground.

Figure 5A:
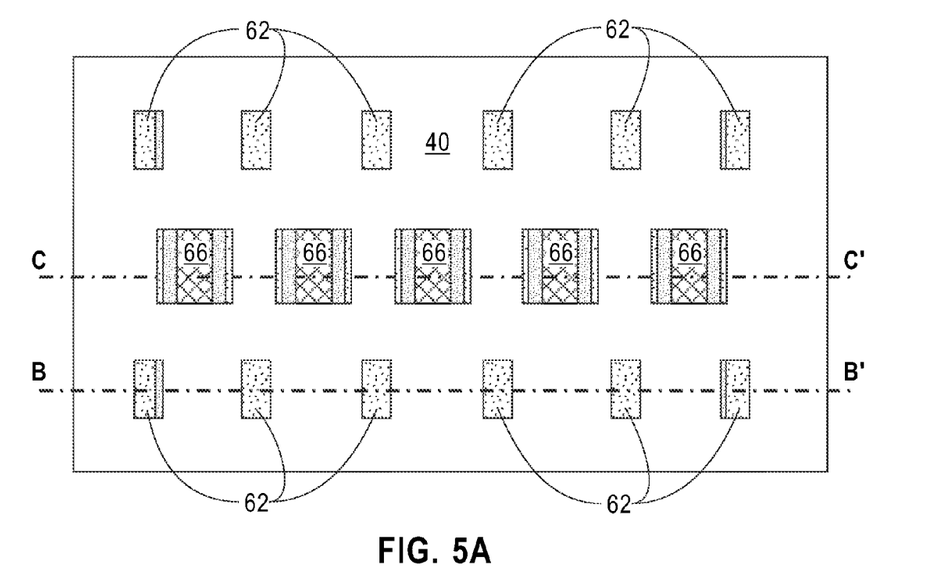
FIG. 5A is a top view of a second exemplary semiconductor structure that can be derived from the semiconductor structure of FIGS. 2A-2C after forming a plurality of source/drain contact openings and a plurality of inter-gate dielectric contact openings through the ILD layer in accordance with another embodiment of the present application.
Figure 5B:
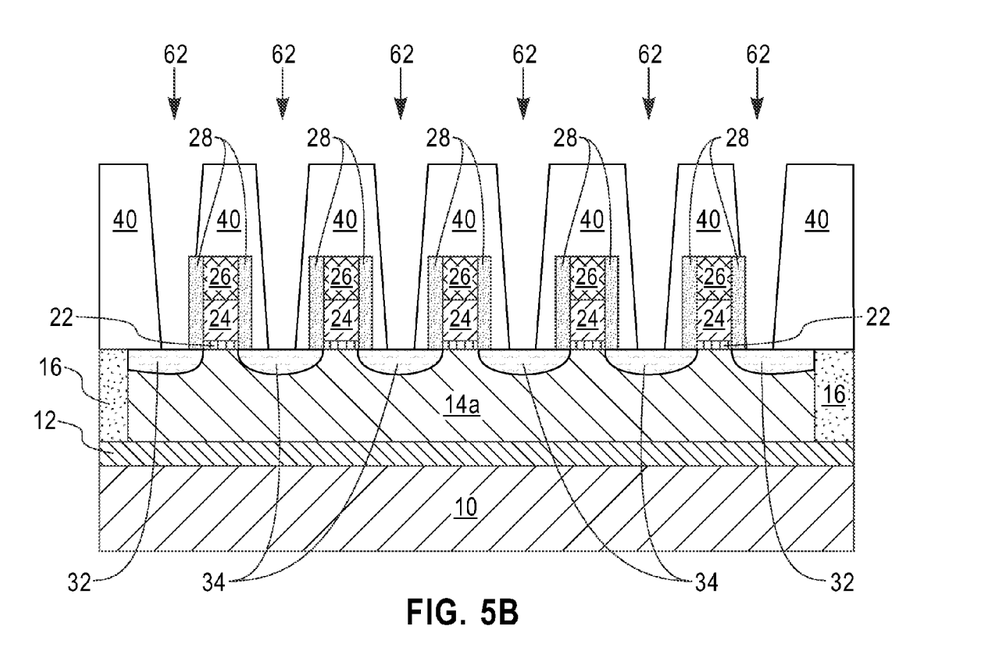
FIG. 5B is a cross-sectional view of the second exemplary semiconductor structure of FIG. 5A along line B-B'.
Figure 5C:
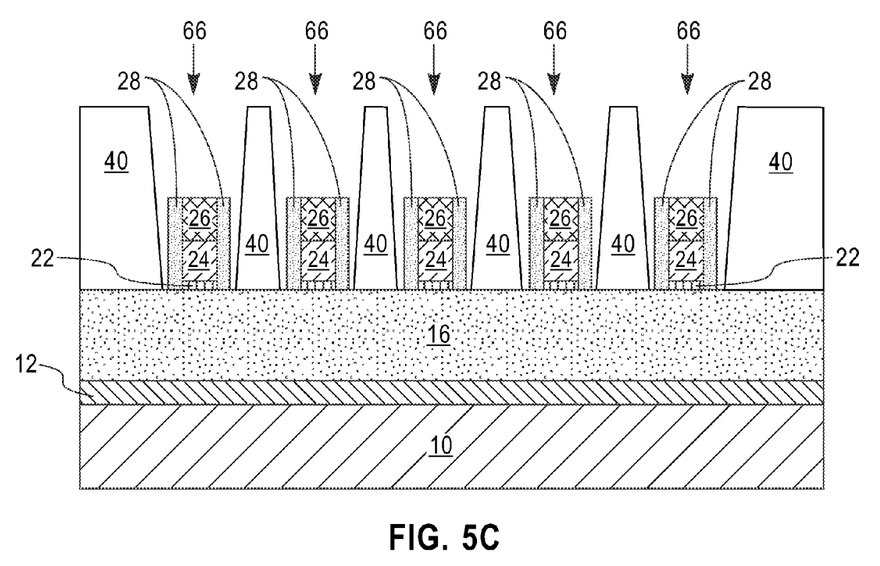
FIG. 5C is a cross-sectional view of the second exemplary semiconductor structure of FIG. 5A along line C-C'.

Referring to FIGS. 5A-5C, various contact openings for the second exemplary flash memory array are formed in the ILD layer 40. The various contact openings can include source/drain contact openings 62 and inter-gate dielectric contact openings 66. The source/drain contact openings 62 extend through the ILD layer 40 to top surfaces of the first and source/drain regions 32, 34. In one embodiment of the present application, the source/drain contact openings 62 that locate in the first source/drain region 32 and expose portions of the first source/drain regions 32 also expose portions of the dielectric gate spacer 28, thus are self-aligned. The inter-gate dielectric contact openings 64 extend through the ILD layer 40 to the top surface of the at least one STI region 16. The inter-gate dielectric contact openings 66 expose portions of the gate structures 20 and portions of the at least one STI region 16 abutting the dielectric gate spacer 28. The various contact openings 62, 64, 64 can be formed by the same processing step described above with respect to FIGS. 3A-3C.

Figure 6A:
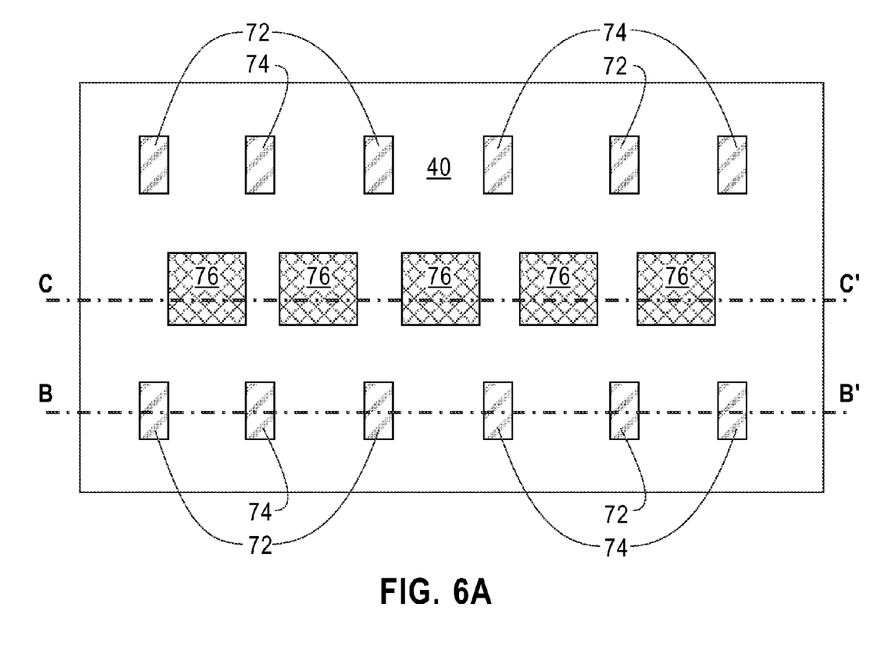
FIG. 6A is a top view of the second exemplary semiconductor structure of FIG. 5A after forming a plurality of source/drain contact structures and a plurality of inter-gate dielectric contact structures.
Figure 6B:
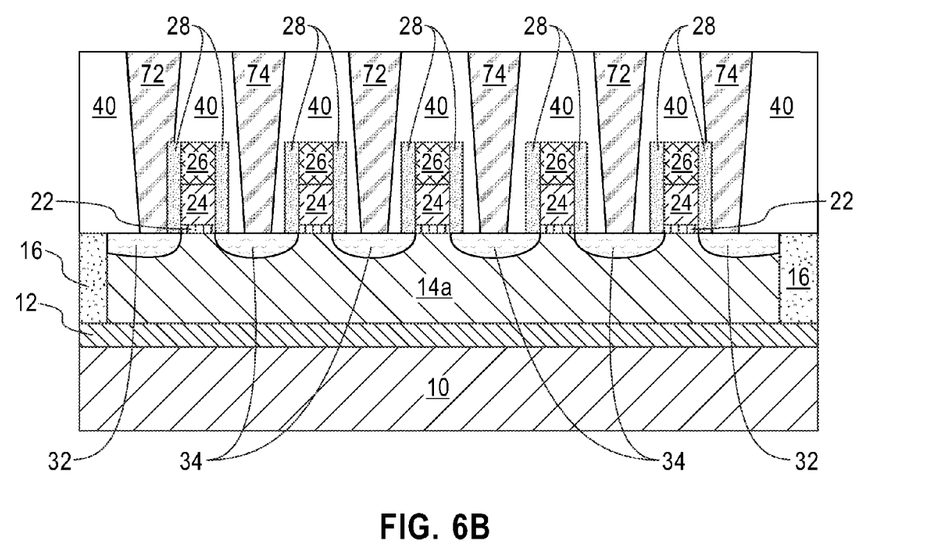
FIG. 6B is a cross-sectional view of the second exemplary semiconductor structure of FIG. 6A along line B-B'.
Figure 6C:
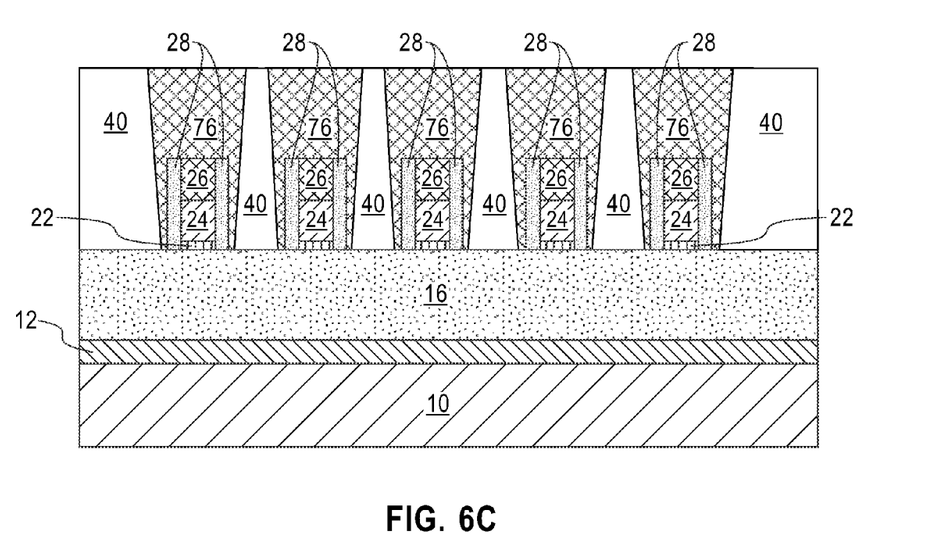
FIG. 6C is a cross-sectional view of the second exemplary semiconductor structure of FIG. 6A along line C-C'.

Referring to FIGS. 6A-6C, various contact structures for the second exemplary flash memory array are formed by the same processing step described above with respect to FIGS. 4A-4C. The various contact structures can include a first set of source/drain contact structures 72 and a second set of source/drain contact structures 74 that fill the first source/drain contact openings 62, and inter-gate dielectric contact structures 76 that fill the inter-gate dielectric contact openings 66. Each of the first and second sets of source/drain contact structures 72, 74 extends through the ILD layer 40 and contacts a portion of a corresponding first source/drain region 32 or a corresponding second source/drain region 34. Each of the inter-gate dielectric contact structures 76 extends through the ILD layer 40 and surrounds a corresponding gate structure 20 such that the inter-gate dielectric contact structure 76 is in contact with exposed surfaces of the dielectric gate cap 26, the dielectric gate spacer 28 and portions of the STI region 16 abutting the dielectric gate spacer 28. In the second exemplary flash memory array, the first set of source/drain contact structures 72 are separated from each other by the second set of source/drain contact structures 74. Each of the first set of source/drain contact structures 72 is connected to a bit line (not shown), each of the second set of source/drain contact structures 74 is connected to ground (not shown), and each inter-gate dielectric contact structure 76 is connected to a word line (not shown).

Figure 7:
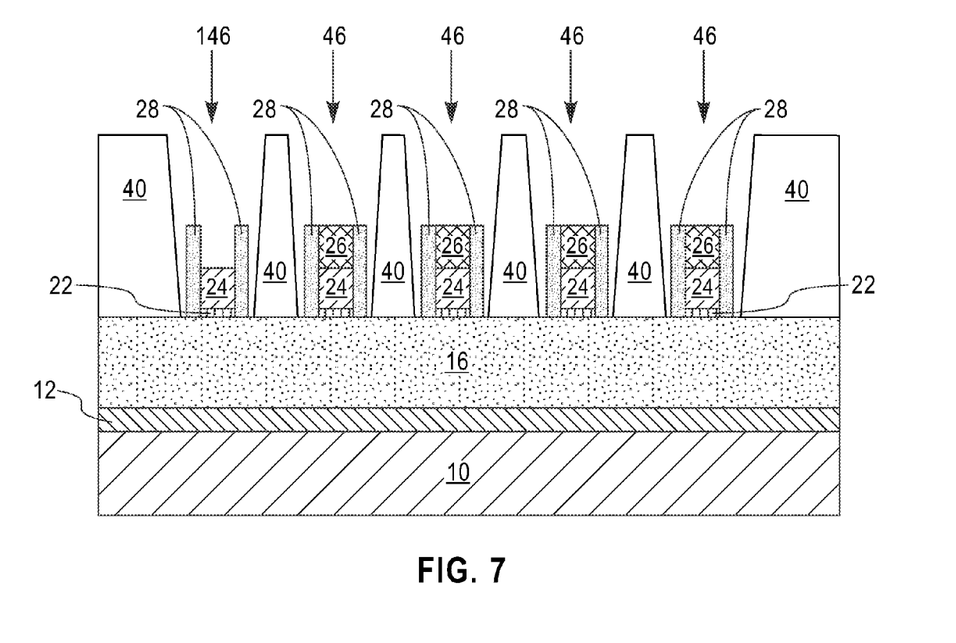
FIG. 7 is a cross-sectional view of a semiconductor structure that can be derived from the first exemplary semiconductor structure of FIGS. 3A-3C after forming a plurality of gate contact openings.
Figure 8:
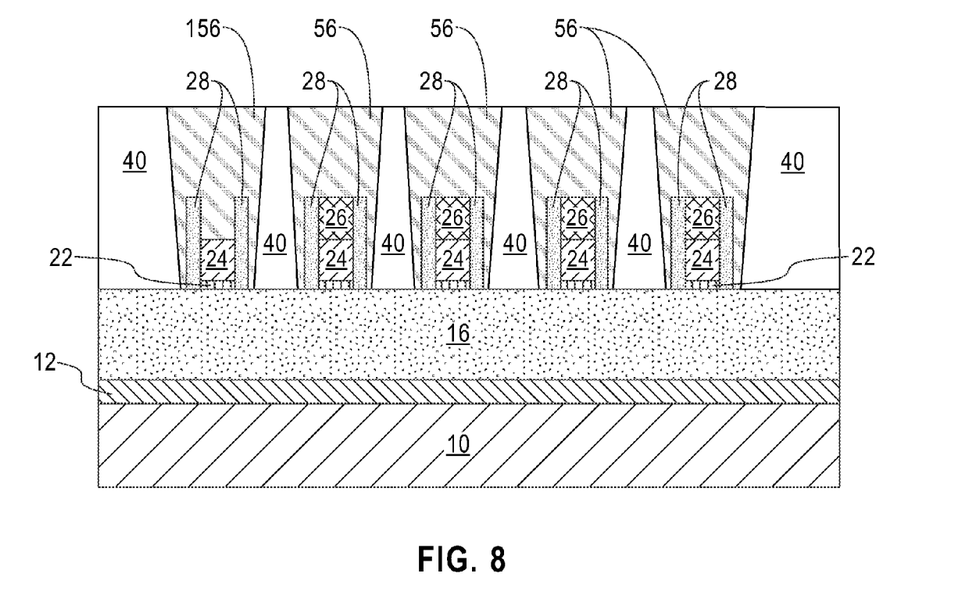
FIG. 8 is a cross-sectional view of the semiconductor structure of FIG. 7 after forming a plurality of gate contact structures.

Since the fabrication process involved in making the first and the second exemplary flash memory arrays in the present application is compatible with the standard CMOS fabrication process, the flash memory arrays of the present application described above can be easily integrated with logic devices. FIGS. 7 and 8 are various cross-sectional views illustrating steps for forming an integrated circuit containing a flash memory array and logic devices from the first exemplary flash memory array of FIGS. 3A-3C. Although not shown, it should be noted that the same processing steps can be employed to form an integrated circuit containing a flash memory array and logic devices from second exemplary flash memory array of FIGS. 5A-5C.

Referring to FIG. 7, after forming the inter-gate dielectric contact openings 46, a photoresist layer (not shown) is deposited over the substrate and lithographically patterned to expose a gate structure 20 in the leftmost row of the plurality of gate structures 20. The dielectric gate cap 26 is removed by using a dry etch or a wet chemical etch selective to the gate conductor 24 to provide a gate conductor contact opening 146. After removing the dielectric gate cap 26, the top surface of the gate conductor 24 is physically exposed in the gate conductor contact opening 146.

Referring to FIG. 8, various contact structures for the first exemplary flash memory array and the logic device are formed by the same processing step described above with respect to FIGS. 4A-4C. In one embodiment and as shown in FIG. 8, a gate contact structure 156 that fills the gate contact opening 146 form direct contact with the gate conductor 24, thus serve as a gate contact for the logic devices.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A flash memory array comprising:
   a substrate comprising a plurality of active regions separated from each other by at least one shallow trench isolation (STI) region;
   a plurality of gate structure formed over the plurality of active regions, wherein each of the plurality of gate structures comprises a vertical stack of a gate dielectric, a floating gate and a dielectric gate cap, and a dielectric gate spacer present on each sidewall of the vertical stack; and
   a plurality of control gates extending through an interlevel dielectric (ILD) layer, wherein each of the plurality of control gates encloses a portion of a corresponding gate structure located at the at least one STI region and is in contact with the dielectric gate cap, the dielectric gate spacer and a portion of the at least one STI region abutting the dielectric gate spacer such that each of the plurality of control gates is electrically insulated from the floating gate by the dielectric gate cap and the dielectric gate spacer.

2. The flash memory array of claim 1, wherein each of the plurality of control gates connects to a word line.

3. The flash memory array of claim 1, wherein each of the plurality of control gates is electrically insulated from the plurality of the active regions.

4. The flash memory array of claim 1, wherein the dielectric gate cap has a thickness no greater than 10 nm, and wherein the dielectric gate spacer has a thickness no greater than 10 nm.

5. The flash memory array of claim 1, further comprising a source region and a drain region located on opposite sides of each of the plurality of gate structures.

6. The flash memory array of claim 5, further comprising a plurality of source/drain contact structures extending through the ILD layer and in contact with portions of the source regions and the drain regions.

7. The flash memory array of claim 6, wherein at least one source/drain contact structure of the plurality of source/drain contact structures contacts a portion of a corresponding gate structure.

8. The flash memory array of claim 7, wherein the plurality of source/drain contact structures are in contact with portions of the source/drain regions located between the at least one STI region and neighboring gate structures at opposite ends of each of the plurality of active regions.

9. The flash memory array of claim 8, wherein each of source/drain contact structures located at one end of each of the plurality of active regions connects to ground, wherein each of a plurality of source/drain contact structures located at another end of each of the plurality of active regions connects to a bit line.

10. The flash memory array of claim 7, wherein the plurality of source/drain contact structures comprises a first set of source/drain contact structures and a second set of source/drain structures that are separated from each other by the first set of source/drain contact structures, wherein each of the first set of source/drain contact structures connects to a bit line, and each of the second set of source/drain contact structures connects to ground.

11. A method of forming a flash memory array comprising:
    forming a plurality of gate structures over a substrate having a plurality of active regions separated from each other by at least one shallow trench isolation (STI) region, wherein each of the plurality of gate structures comprises a vertical stack of a gate dielectric, a gate conductor and a dielectric gate cap, and a dielectric gate spacer present on each sidewall of the vertical stack;
    forming a source region and a drain region on opposite side of each of the plurality of gate structures;
    forming an interlevel dielectric (ILD) layer over the substrate, the ILD layer having a planar top surface above topmost surfaces of the plurality of gate structures;
    forming a plurality of inter-gate dielectric contact openings and a plurality of source/drain contact openings through the ILD layer, wherein each of the plurality of inter-gate dielectric contact openings exposes a portion of a corresponding gate structure located at the at least one STI region and a portion of the at least one STI region abutting the dielectric gate spacer of the corresponding gate structure, and wherein each of the plurality of source/drain contact openings exposes a portion of a source region or a drain region; and
    filling the plurality of inter-gate dielectric contact openings and the plurality of source/drain contact openings with a conductive material to provide a plurality of inter-gate dielectric contact structures and a plurality of source/drain contact structures.

12. The method of claim 11, wherein at least one source/drain contact structure of the plurality of the source/drain contact structure contacts a portion of a corresponding gate structure.

13. The method of claim 11, further comprising forming an integrated circuit by forming a plurality of logic devices in the flash memory array, wherein the forming the integrated circuit by forming a plurality of logic devices in the flash memory array comprises:
    forming at least one gate contact opening in at least one gate structure of the plurality of gate structures to expose an entire top surface of the gate conductor in the at least one gate structure of the plurality of the gate structures prior to the filling the plurality of gate contact openings and the plurality of source/drain contact openings.

14. The method of claim 13, wherein the forming the at last one gate contact opening comprises removing the dielectric gate cap in the at least one gate structure of the plurality of the gate structures.

15. The method of claim 14, wherein the conductive material fills the at least one gate contact opening to provide at least one gate contact structure for the plurality of logic devices, wherein the at least one gate contact structure is in direct contact with the gate conductor in the at least one gate structure of the plurality of the gate structures.

16. The method of claim 11, further comprising connecting each of the plurality of inter-gate dielectric contact structures to a word line.

17. The method of claim 11, further comprising connecting a first set of the plurality of source/drain contact structures that are located at a first end of each of the plurality of active regions to ground, and connecting a second set of the plurality of source/drain contact structures that are located at a second end of each of the plurality of active regions opposite to the first end in a lengthwise direction to a bit line.

18. The method of claim 11, further comprising connecting each of a first set of the plurality of source/drain contact structures to a bit line and connecting each of a second set of the plurality of source/drain contact structures that are separated from each other by the first set of the plurality of source/drain contact structures to ground.

19. The method of claim 11, wherein the forming the plurality of gate structures comprises:
 forming a gate dielectric layer on the substrate;
 forming a gate conductor layer on the gate dielectric layer;
 forming a dielectric gate cap layer on the gate conductor layer;
 patterning the gate dielectric layer, the gate conductor layer and the dielectric gate cap layer to form a plurality of vertical stack of the gate dielectric, the gate conductor and the dielectric gate cap;
 forming a conformal dielectric gate spacer layer on exposed surfaces of the plurality of vertical stacks and the substrate; and
 removing horizontal portions of the conformal dielectric gate spacer layer to provide the dielectric gate spacer on each sidewall of the plurality of the vertical stack.

20. The method of claim 11, further comprising removing an excess amount of the conductive material from above the ILD layer by a planarization process.

* * * * *